(12) United States Patent
Hwu et al.

(10) Patent No.: US 11,411,535 B2
(45) Date of Patent: *Aug. 9, 2022

(54) SEMICONDUCTOR DEVICE AND OPERATION METHOD THEREOF (71) Applicants: TAIWAN SEMICONDUCTOR MANUFACTURING CO., LTD., Hsinchu (TW); NATIONAL TAIWAN UNIVERSITY, Taipei (TW)

(72) Inventors: Jenn-Gwo Hwu, Taipei (TW); Ting-Hao Hsu, Hsinchu (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/206,000

(22) Filed: Mar. 18, 2021

(65) Prior Publication Data
US 2021/0211097 A1    Jul. 8, 2021

Related U.S. Application Data

(63) Continuation of application No. 16/548,741, filed on Aug. 22, 2019, now Pat. No. 10,958,216.

(51) Int. Cl.
*H03B 19/14* (2006.01)
*G05F 1/56* (2006.01)
*H01L 29/51* (2006.01)

(52) U.S. Cl.
CPC ............ *H03B 19/14* (2013.01); *G05F 1/561* (2013.01); *H01L 29/51* (2013.01)

(58) Field of Classification Search
None
See application file for complete search history.

(56) References Cited

U.S. PATENT DOCUMENTS

| | | |
|---|---|---|
| 3,202,840 A | 8/1965 | Ames, Jr. |
| 3,890,635 A | 6/1975 | Engeler |
| 3,963,977 A | 6/1976 | Mitsui |
| 4,426,737 A | 1/1984 | Mori |
| 4,721,983 A * | 1/1988 | Frazier .................. B82Y 10/00 257/24 |
| 4,806,998 A | 2/1989 | Vinter et al. |

(Continued)

OTHER PUBLICATIONS

The RC Oscillator, 2015, https://www.electronics-tutorials.ws/oscillator/rc_oscillator.html, accessed Jan. 21, 2022.*

(Continued)

*Primary Examiner* — Thomas J. Hiltunen
(74) *Attorney, Agent, or Firm* — Maschoff Brennan (57) ABSTRACT

A device is disclosed that includes an insulating layer, a first electrode, a second electrode, and a bottom electrode. The insulating layer is disposed on a first surface of a substrate. The first electrode and the second electrode are disposed on a first surface of the insulating layer. The first electrode receives an input signal, and the second electrode outputs, in response to the input signal, an output signal. The bottom electrode is disposed on a second surface, opposite to the first surface, of the substrate and receives an operating voltage to modify a frequency of the output signal.

20 Claims, 10 Drawing Sheets

(56) References Cited

U.S. PATENT DOCUMENTS

| | | | |
|---|---|---|---|
| 4,902,912 | A | 2/1990 | Capasso et al. |
| 4,907,045 | A | 3/1990 | Ando |
| 5,093,699 | A | 3/1992 | Weichold et al. |
| 5,241,190 | A | 8/1993 | Eisenstein et al. |
| 5,432,362 | A | 7/1995 | Lippens et al. |
| 5,767,526 | A | 6/1998 | Seabaugh |
| 6,118,136 | A | 9/2000 | Liu et al. |
| 6,172,378 | B1 | 1/2001 | Hull et al. |
| 6,194,737 | B1 | 2/2001 | Ohshima |
| 7,579,642 | B1 | 8/2009 | Bulucea |
| 7,714,412 | B2 | 5/2010 | Coolbaugh et al. |
| 8,564,040 | B1 | 10/2013 | Doris et al. |
| 9,041,440 | B2 | 5/2015 | Appenzeller et al. |
| 10,522,535 | B2 | 12/2019 | Tsai et al. |
| 10,958,216 | B2 * | 3/2021 | Hwu .................. H03B 19/14 |
| 2013/0009714 | A1 * | 1/2013 | Nishitani ............. H01L 28/20 331/108 B |
| 2019/0010344 | A1 | 1/2019 | Ichikawa et al. |

OTHER PUBLICATIONS

Colpitts Ocillator using Op Amp:, no date, https://www.eeeguide.com/colpitts-oscillator-using-op-amp/, accessed Jan. 21, 2022.*

Archive.org capture of The RC Oscillator, https://web.archive.org/web/20150215191642/https://www.electronics-tutorials.ws/oscillator/rc_oscillator.html, 2022, accessed Jan. 21, 2022.*

Chang-Feng Yang et al. "Tunable Negative Differential Resistance in MISIM Tunnel Diodes Structure With Concentric Circular Electrodes Controlled by Designed Substrate Bias", IEEE Transactions on Electron Devices, vol. 64, No. 12, (Dec. 2017), 5230-5235.

Kevin J. Chen et al., "Frequency Multipliers Using InP-Based Resonant-Tunneling High Electron Mobility Transistors", IEEE Electron Device Letters, vol. 17, No. 5, (May 1996), 235-238.

Zhongzhong Luo et al., "Negative transconductance in multi-layer organic thin-film transistors", Nanotechnology 30 32LT01, (Nov. 9, 2018), 1-6.

Yuan Liu et al., "Vertical Charge Transport and Negative Transconductance in Multilayer Molybdenum Disulfides" Nano Lett. 2017, 17, 5495-5501.

* cited by examiner

SEMICONDUCTOR DEVICE AND OPERATION METHOD THEREOF

CROSS REFERENCE

This application is a continuation of U.S. application Ser. No. 16/548,741, filed Aug. 22, 2019, now U.S. Pat. No. 10,958,216, issued on Mar. 23, 2021, which is herein incorporated by reference.

BACKGROUND

Frequency multipliers are often used in frequency synthesizers and communications circuits. Some works have demonstrated a frequency doubler with a single device utilizing negative transconductance phenomenon. However, either low temperature is required for the device to operate, or the fabrication of the device is more complicated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Figure 1A:
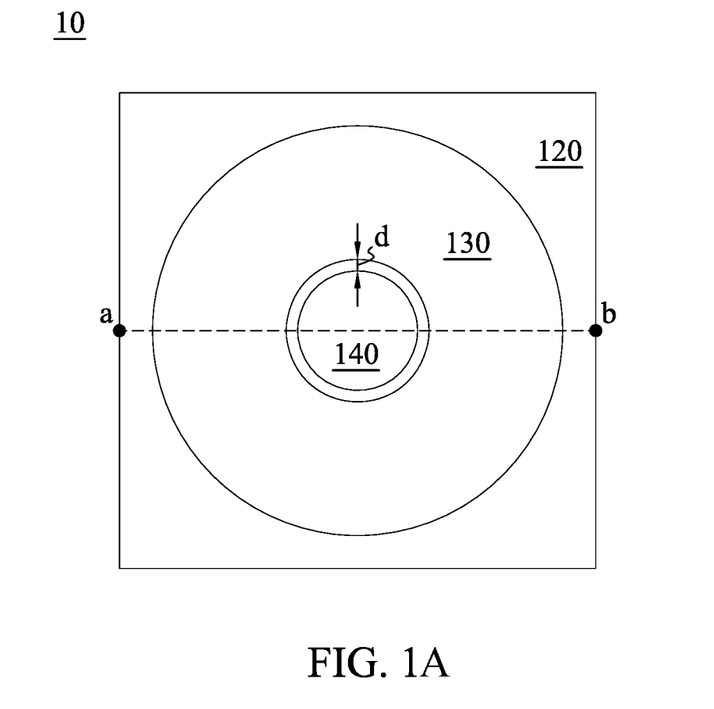
FIG. 1A is a top view of a schematic layout of a device, in accordance with some embodiments of the present disclosure.
Figure 1B:
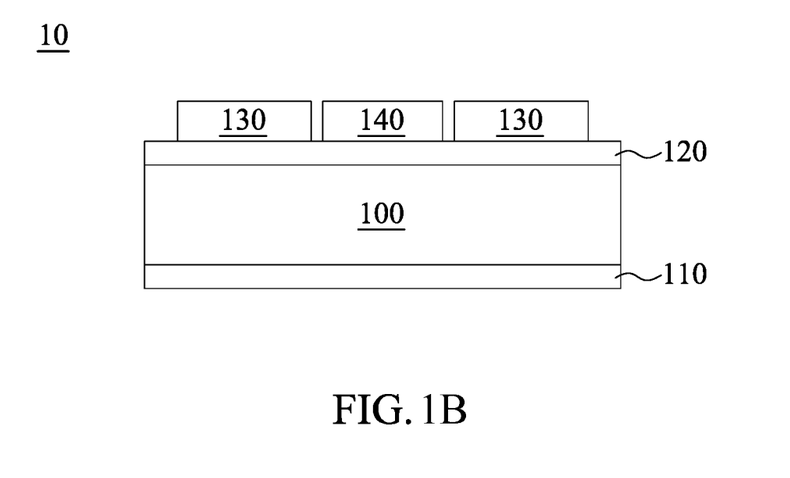
FIG. 1B is a schematic side view of components in the device, taken along a line a-b, in FIG. 1A, in accordance with some embodiments of the present disclosure.

Reference is now made to both of FIG. 1A and FIG. 1B. FIG. 1A is a top view of a schematic layout of a device 10, in accordance with some embodiments of the present disclosure. FIG. 1B is a schematic side view of the device 10, taken along a line a-b, in FIG. 1A, in accordance with some embodiments of the present disclosure. In some embodiments, the device 10 is implemented in a frequency multiplier device or as a frequency multiplier device.

As illustratively shown in FIG. 1A and FIG. 1B, the device 10 includes a semiconductor substrate 100, a bottom electrode 110, an insulating layer 120 and electrodes 130, 140. For illustration, the bottom electrode 110 is disposed on a first surface of the semiconductor substrate 100. The insulating layer 120 is disposed on a second surface that is opposite to the first surface, of the semiconductor substrate 100. The electrodes 130, 140 are separate from each other and disposed on the insulating layer 120, in which the electrode 130 surrounds the electrode 140.

In some embodiments, the semiconductor substrate 100 includes or consists primarily of a group II, a group III, a group IV, a group V, and/or a group VI element, and/or combinations thereof, for example, selected from the group consisting of silicon, germanium, silicon germanium, gallium arsenide, aluminum antimonide, etc. and combinations thereof. Furthermore, in some embodiments, the semiconductor substrate 100 is made of a N-type semiconductor material with N-type dopants with a doping concentration of about $5\times10^{14}/cm^{-3}$ to about $5\times10^{17}/cm^{-3}$, or is made of a P-type semiconductor material with a doping concentration of about $5\times10^{14}/cm^{-3}$ to about $5\times10^{17}/cm^{-3}$. However, the material and the doping concentration of the semiconductor substrate 100 described above are given for illustrative purposes, and the ways to implement the present disclosure are not limited thereto. Persons of ordinary skill in the art can use any suitable material and adjust the doping concentration according to various applications.

In some embodiments, the bottom electrode 110 is made of any suitable conductive material including, but not limited to, aluminum, gold, titanium, polysilicon, silver, nickel, copper, or a combination thereof.

In some embodiments, the insulating layer 120 is made of any insulating material. For example, the insulating layer 120 is an oxide layer or a nitride layer. In some embodiments, when the semiconductor substrate 100 is made of silicon, the insulating layer 120 is made of silicon oxide, silicon nitride, or silicon dioxide. The material for making the insulating layer 120, however, is not limited thereto. Furthermore, in some embodiments, a thickness of the insulating layer 120 is in a range from about 20 nm to about 40 nm, so that the quantum tunnel effect between the electrode 130 and the electrode 140 occurs. In other words, the insulating layer 120 is formed at such a thickness that a tunnel current flows from the electrode 130 to the electrode 140 or from the electrode 140 to electrode 130 when a voltage is applied between the electrode 130 and the electrode 140.

In some embodiments, the electrodes 130, 140 are formed by patterning a metal layer formed on the insulating layer 120. For illustration of FIG. 1, the electrode 130 has a ring shape surrounding the electrode 140, and the electrode 140 has a circular shape, which is separated from the electrode 130 with a distance d. In some embodiments, the electrode 130 is a continuous electrode having any suitable shape which surrounds the electrode 140. The above configurations of the electrode 130 and the electrode 140 are given for illustrative purposes. Various configurations of the electrode 130 and the electrode 140 are within the contemplated scope of the present disclosure. For example, in various embodiments, the electrode 140 has a rectangular shape.

In some embodiments, the electrodes 130, 140 are formed of the same conductive material, such like aluminum, hafnium, magnesium, or an alloy thereof. Accordingly, the structure of the device 10 For illustration with reference to FIG. 1B is also referred to as a metal-insulator-semiconductor (MIS) structure. For the ease of understanding the present disclosure, in the following paragraphs, the electrode 130, the insulating later 120 and the semiconductor substrate 100 are collectively referred to as a ring MIS structure, and the electrode 140, the insulating later 120 and the semiconductor substrate 100 are collectively referred to as a center MIS structure.

Figure 2:
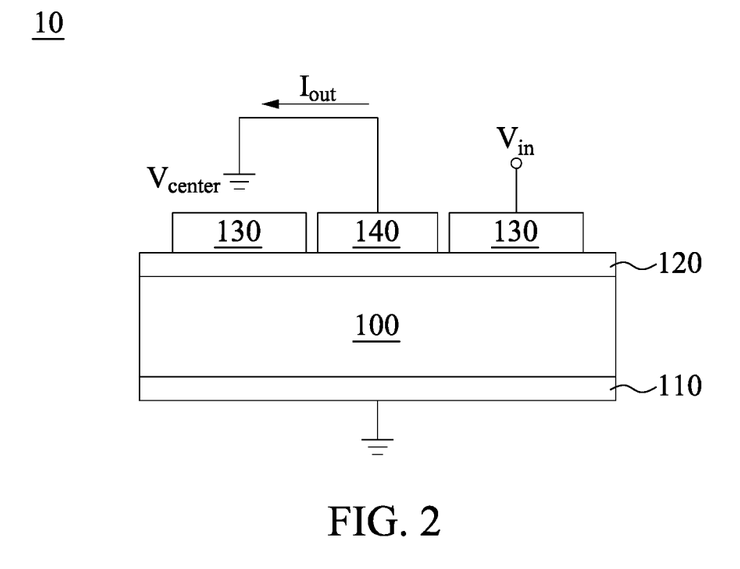
FIG. 2 is a schematic diagram of the device operating with an input signal, in accordance with some embodiments of the present disclosure.

Reference is now made to FIG. 2. FIG. 2 is a schematic diagram of the device 10 operating with an input signal Vin, in accordance with some embodiments of the present disclosure.

For illustration, the bottom electrode 110 is configured to be coupled to a ground voltage (i.e., 0 Volts). The electrode 130 is configured to be applied with the input signal Vin. The electrode 140 is configured to output an output current signal Iout that is associated with the input signal Vin while the electrode 140 is biased with a voltage Vcenter which, for illustration, has 0 Volts.

Figure 3:
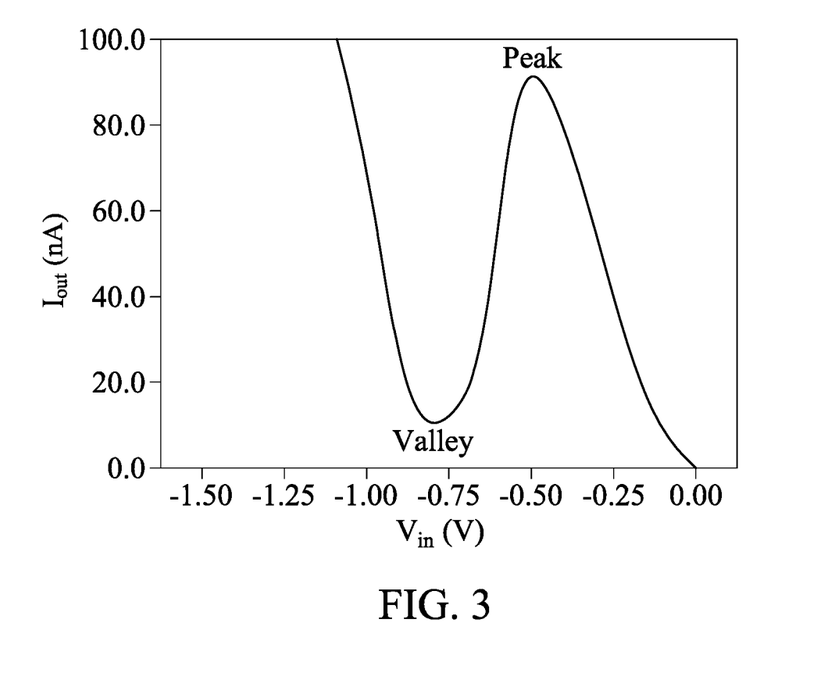
FIG. 3 is a chart illustrating an output current signal versus the input signal in FIG. 2, in accordance with some embodiments of the present disclosure.

Reference is now made to FIG. 3. FIG. 3 is a chart illustrating an output current signal Iout versus the input signal Vin in FIG. 2, in accordance with some embodiments of the present disclosure.

For illustration, the input signal Vin is configured to have a voltage level that is variable. In some embodiments, the input signal Vin is an oscillating signal including, for example, a triangular wave signal or any oscillating signal with a fixed oscillating frequency. When the input signal Vin is applied on the electrode 130, the output current signal Iout is accordingly generated and configured to have a peak current value and a valley current value For illustration with reference to FIG. 3. For illustration with reference to FIG. 3, the input signal Vin as an oscillating signal is configured to have a first voltage value corresponding to a peak of the output current signal Iout and a second voltage value corresponding to a valley of the output current signal Iout.

For another illustration with reference to FIG. 3, the current-voltage characteristic curve of the output current signal Iout corresponding to the input signal Vin includes several voltage ranges, in one of which a transconductance is negative. For example, in some embodiments, in some voltage ranges with positive transconductance, when the absolute value of input signal Vin increases, the output current signal Iout increases. Alternatively, in some voltage ranges with negative transconductance, when the absolute value of input signal Vin decreases, the output current signal Iout increases. The detail of operation will be discussed below.

With continued reference to FIG. 3, in some embodiments, the voltage level of the input signal Vin changes from 0V to a first voltage value. For example, in some embodiments, the first voltage value is about −0.5V. When the input signal Vin changes from about 0V to about −0.5V, the absolute value of the input signal Vin increasing, inversion charges under the ring MIS structure gain more energy and couple with the charges under the center MIS structure. The charges under the center MIS structure flowing to the electrode 140 results in the output current signal Iout, and the absolute value of the output current signal Iout increases accordingly. In such a case, the device 10 operates with positive transconductance, and the output current signal Iout has the peak current value.

Furthermore, in some embodiments, the voltage level of the input signal Vin changes from the first voltage value to a second voltage value. For illustration with reference to FIG. 3, the first voltage value is about −0.5 Volts and the second voltage value is about −0.8 Volts. When the input signal Vin changes from about −0.5 Volts to about −0.8 Volts, For illustration with reference to FIG. 3, the absolute value of the input signal Vin continuously increasing, the coupling becomes stronger, but the amount of inversion charges under the ring MIS structure decreases because the relative high energy inversion charges under the ring MIS structure transfer to the electrode 110, rather than couple to the center MIS structure. Alternatively stated, the factor of the coupling strength and the factor of the amount of inversion charges compete. Accordingly, because the lacking of the inversion charges dominates, the absolute value of the output current signal Iout decreases. In such a case, the device 10 operates with negative transconductance, and the output current signal Iout has the valley current value.

In addition, according to some embodiments, the voltage level of the input signal Vin changes from the second voltage value (e.g., the second voltage value is about −0.8 Volts) to about −1.5 Volts. For illustration with reference to FIG. 3, when the voltage level of the input signal Vin changes from about −0.8 Volts to about −1.5 Volts, the absolute value of the input signal Vin continuously increasing, the electrons are injected from the electrode 130 as the supply of the minority carriers and move to the electrode 140. Accordingly, the absolute value of the output current signal Iout increases again and the device 10 operates with positive transconductance.

The above values and ranges are given for illustrative purposes. Various values and ranges are within the contemplated scope of the present disclosure. For example, in various embodiments, the first voltage value corresponding to the peak of the output current signal Iout and the second voltage value corresponding to the valley of the output current signal Iout are adjusted when the voltage for biasing the bottom electrode 110 of FIG. 2 is modified, as will be discussed in detail below.

Figure 4:
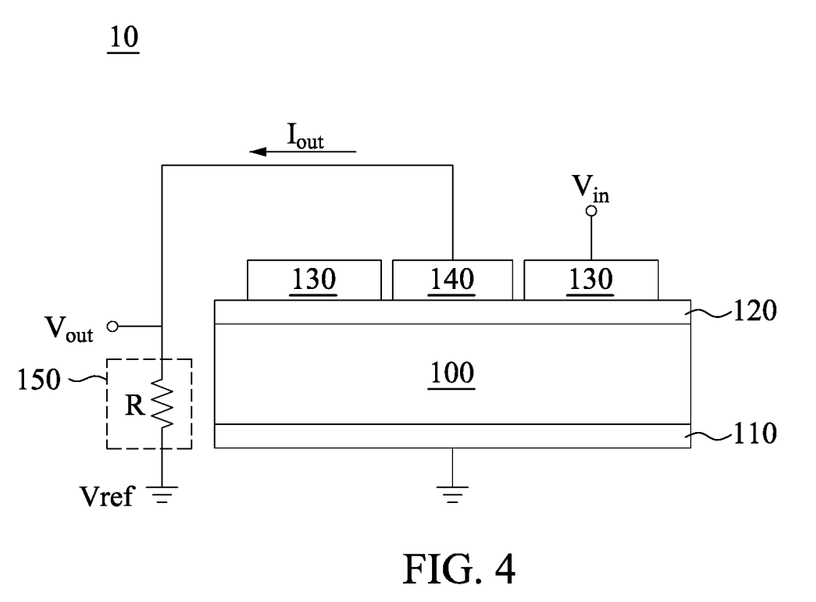
FIG. 4 is a schematic diagram of the device operating with an input signal, in accordance with some embodiments of the present disclosure.

Reference is now made to FIG. 4. FIG. 4 is a schematic diagram of the device 10 operating with the input signal Vin, in accordance with some embodiments of the present disclosure.

In some embodiments, the device 10 further includes a current-to-voltage converter 150. For illustration, the current-to-voltage converter 150 is coupled in series between the electrode 140 and a reference voltage Vref (e.g., ground voltage). The current-to-voltage converter 150 is configured to receive the output current signal Iout to generate an output voltage signal Vout. In some embodiments, the current-to-voltage converter 150 is implemented by a resistor R For illustration with reference to FIG. 3. In some embodiments, the resistor R has a resistance which is small enough to prevent the voltage of the electrode 140 from being driven too far away from a working bias 0 Volts. For example, the resistance of the resistor R is in a range between about 1 kΩ and about 100 kΩ.

The above configurations of the current-to-voltage converter 150 are given for illustrative purposes. Various configurations of the current-to-voltage converter 150 are within the contemplated scope of the present disclosure. For example, in various embodiments, the current-to-voltage converter 150 is implemented by a transistor, a diode, or any suitable element that is able to provide sufficient resistance as discussed above.

Figure 5A:
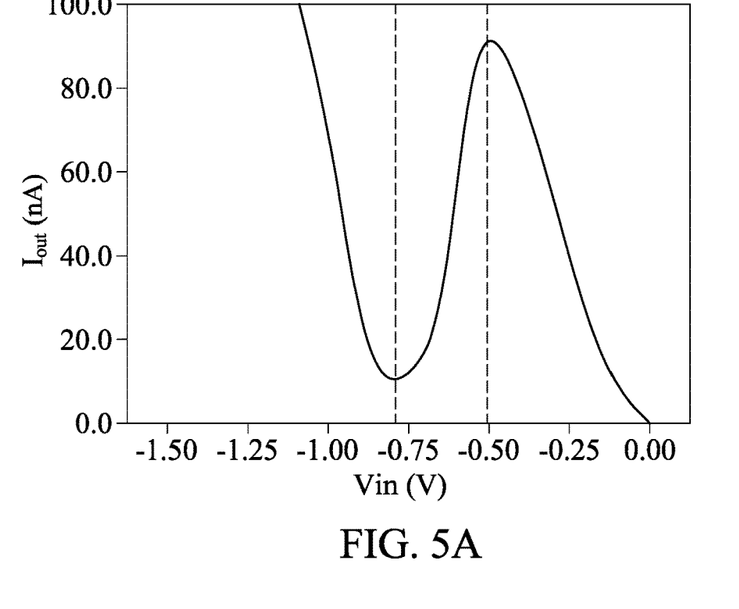
FIG. 5A is a chart illustrating an output current signal versus the input signal in FIG. 4, in accordance with some embodiments of the present disclosure.
Figure 5B:
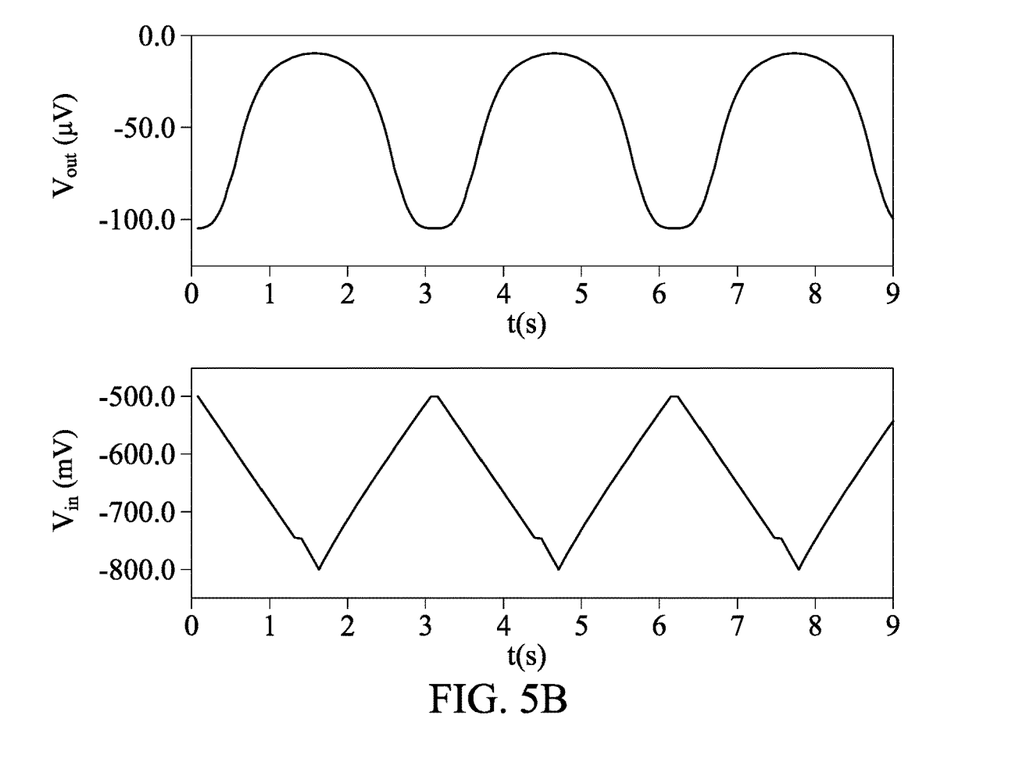
FIG. 5B illustrates the input signal and the corresponding output voltage signal.

Reference is now made to both of FIG. 5A and FIG. 5B. FIG. 5A is a chart illustrating the output current signal Iout versus the input signal Vin in FIG. 4, in accordance with some embodiments of the present disclosure. FIG. 5B illustrates the input signal Vin and the corresponding output voltage signal Vout.

For illustration with reference to FIG. 5A, the current-voltage curve in the embodiments shown in FIG. 5A has a peak current value when the input signal Vin has a first voltage value which is about −0.5 Volts, and the current-voltage curve has a valley current value when the input signal Vin has a second voltage value which is about −0.8 Volts. For illustration, the device 10 is configured to operate with negative transconductance between the first voltage value and the second voltage value.

For illustration with reference to FIG. 5B, in some embodiments, the input signal Vin is a triangular wave and the voltage level of the input signal Vin oscillates between about −500 mV and about −800 mV. When the input signal Vin is changed from about −500 mV to about −800 mV, the output voltage signal Vout generated by the current-to-voltage converter 150 accordingly is changed from about −100 μV to about 0 Volts. Alternatively, when the voltage level of the input signal Vin is changed from about −800 mV to about −500 mV, the output voltage signal Vout accordingly is changed from about 0 Volts to about −100 μV. Moreover, when the absolute value of the input signal Vin increases, the absolute value of the output voltage signal Vout decreases. When the absolute value of the input signal Vin decreases, the absolute value of the output voltage signal Vout increases. Consequently, the output voltage signal Vout has a phase opposite to a phase of the input signal Vin. Alternatively stated, when the input signal Vin oscillates within a range between the first voltage value and the second voltage value, the output voltage signal Vout is a signal inverted from the input signal Vin. In addition, the output voltage signal Vout has the same oscillating frequency as the oscillating frequency of the input signal Vin. Explained in a different way, based on the above, the device 10 in FIG. 4 operates as an inverter.

Figure 6A:
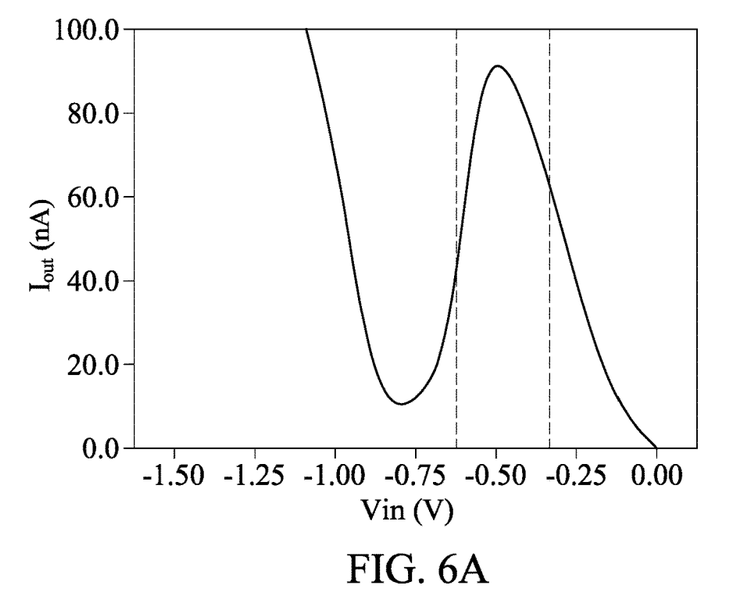
FIG. 6A is a chart illustrating an output current signal versus the input signal in FIG. 4, in accordance with some embodiments of the present disclosure.
Figure 6B:
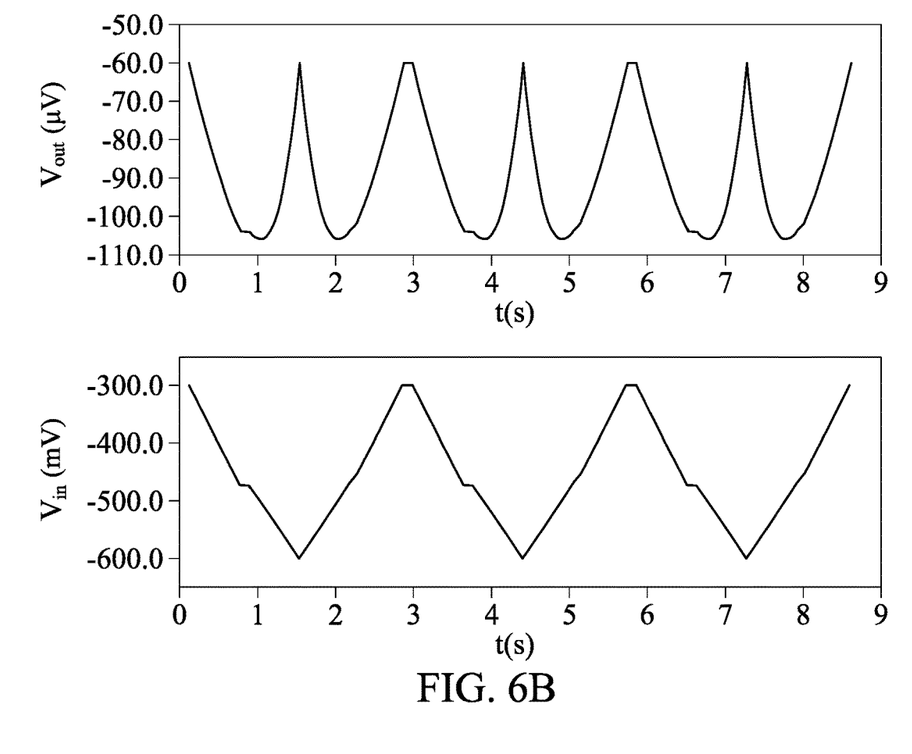
FIG. 6B illustrates the input signal and the corresponding output voltage signal.

Reference is now made to both of FIG. 6A and FIG. 6B. FIG. 6A is a chart illustrating the output current signal Iout versus the input signal Vin in FIG. 4, in accordance with some embodiments of the present disclosure. FIG. 6B illustrates the input signal Vin and the corresponding output voltage signal Vout.

For illustration with reference to FIG. 6A, the current-voltage curve in the embodiments shown in FIG. 6A is similar to the current-voltage curve in the embodiments shown in FIG. 5A. As shown in FIG. 6A, the device 10 is configured to operate with positive transconductance when the input signal Vin is larger than the first voltage value, that is in a range between about 0 Volts and about −0.5 Volts. The device 10 is configured to operate with negative transconductance when the input signal Vin is in a range between the first voltage value and the second voltage value, that is in a range between −0.5 Volts and −0.8 Volts.

For illustration with reference to FIG. 6B, in some embodiments, the input signal Vin is a triangular wave and the voltage level of the input signal Vin oscillates between about −305 mV and about −605 mV. For illustration, the voltage level of the input signal Vin is configured in a range including the first value (e.g., about −500 mV), other than the second value (e.g., about −800 mV), the output voltage signal Vout has a frequency that is two times a frequency of the input signal Vin. For example, as shown in FIG. 6B, in the first half of oscillation of the input signal Vin, the voltage level of the input signal Vin is changed from about −305 mV to about −600 mV. Accordingly, the output voltage signal Vout firstly is changed from about −60 μV to about −105 μV while the device 10 operating with positive transconductance. Secondly, the output voltage signal Vout is changed from −105 μV to about −60 μV while the device 10 operating with negative transconductance. Furthermore, in the second half of oscillation of the input signal Vin, the voltage level of the input signal Vin is changed from about −305 mV to about −600 mV. Accordingly, as illustrated in FIG. 6B, the output voltage signal Vout is changed in the same way as discussed above. In other words, when the input signal Vin oscillates within a range including the first voltage value without the second voltage value, the output voltage signal Vout has a frequency that is two times a frequency of the input signal Vin. Explained in a different way, based on the above, the device 10 in FIG. 4 operates as a frequency doubler circuit or device.

Figure 7A:
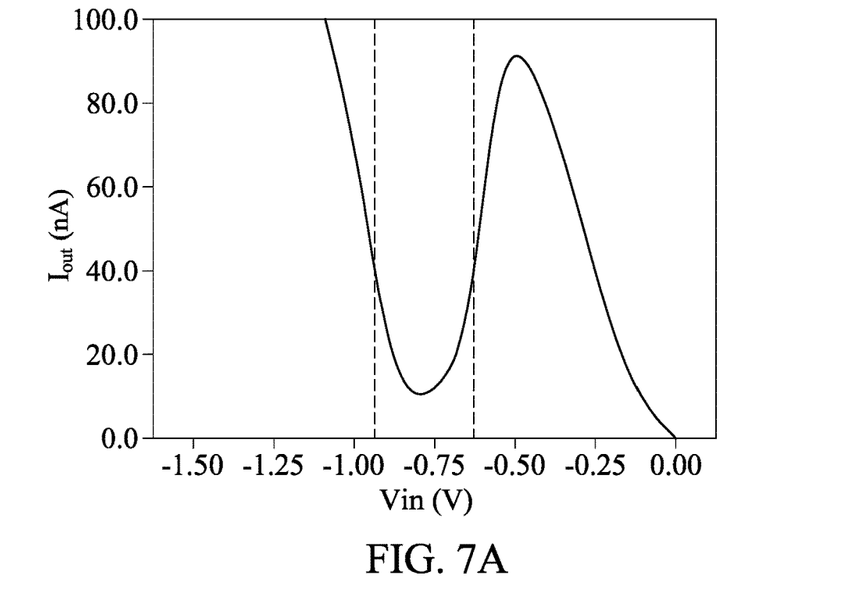
FIG. 7A is a chart illustrating an output current signal versus the input signal in FIG. 4, in accordance with some embodiments of the present disclosure.
Figure 7B:
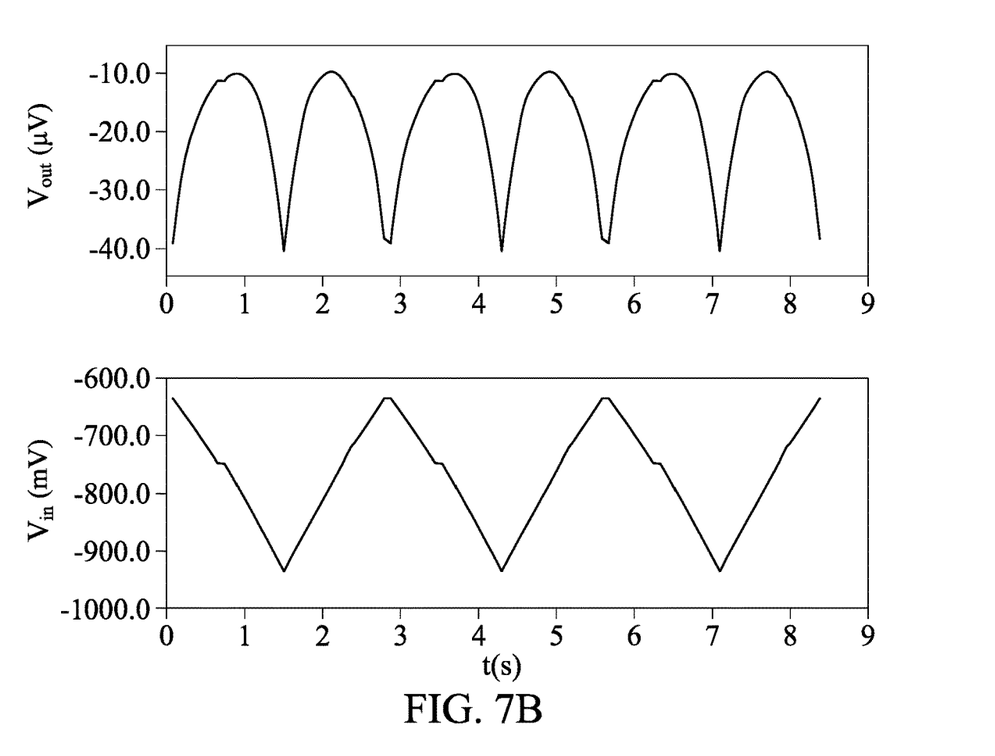
FIG. 7B illustrates the input signal and the corresponding output voltage signal.

Reference is now made to both of FIG. 7A and FIG. 7B. FIG. 7A is a chart illustrating the output current signal Iout versus the input signal Vin in FIG. 4, in accordance with some embodiments of the present disclosure. FIG. 7B illustrates the input signal Vin and the corresponding output voltage signal Vout.

For illustration with reference to FIG. 7A, the current-voltage curve in the embodiments shown in FIG. 7A is similar to the current-voltage curve in the embodiments shown in FIG. 5A and FIG. 6A. For illustration, the device 10 is configured to operate with negative transconductance when the input signal Vin is in a range between the first voltage value and the second voltage value, that is in a range between about −0.5 Volts about −0.8 Volts. The device 10 is configured to operate with positive transconductance when the input signal Vin is smaller than the second voltage value, that is in a range between about −0.8 Volts to about −1.5 Volts.

For illustration with reference to FIG. 7B, in some embodiments, the input signal Vin is a triangular wave and the voltage level of the input signal Vin oscillates between about −635 mV and about −935 mV. For illustration, when the voltage level of the input signal Vin is configured in a range including the second value (e.g., about −800 mV), other than the first value (e.g., about −500 mV), the output voltage signal Vout has a phase opposite to a phase of the input signal Vin and has a frequency that is two times a frequency of the input signal Vin. In other words, when the input signal Vin oscillates within a range including the second voltage value (e.g., about −800 mV) without the first voltage value (e.g., about −500 mV), the output voltage signal Vout is configured to be a signal inverted from the input signal Vin and having a frequency that is two times a frequency of the input signal Vin. For example, as shown in FIG. 7B, in some embodiments, in the first half of oscillation of the input signal Vin, the input signal Vin is changed from about −635 mV to about −935 mV, the absolute value of the input signal Vin increasing. Accordingly, the absolute value of the output voltage signal Vout firstly decreases from about 40 μV to about 10 μV as the device 10 operating with negative transconductance in a voltage range between about −635 mV and about −800 mV, and secondly the absolute value of the output voltage signal Vout increases from about 10 μV to about 40 μV as the device 10 operating with positive transconductance in a voltage range between about −800 mV and about −935 mV. Alternatively, in the second half of the oscillation of the input signal Vin, the input signal Vin is changed from about −935 mV to about −635 mV, the absolute value of the input signal Vin decreasing. Accordingly, the absolute value of the output voltage signal Vout firstly decreases from about 40 μV to about 10 μV as the device 10 operating with positive transconductance in a voltage range between about −935 mV and about −800 mV, and secondly the absolute value of the output voltage signal Vout increases from about 10 μV to about 40 μV as the device 10 operating with negative transconductance in a voltage range between about −800 mV and about −635 mV. In other words, as the input signal Vin oscillates for one time, the output voltage signal Vout oscillates correspondingly two times and out-of-phase of the input signal Vin. Explained in a different way, based on the above, the device 10 in FIG. 4 operates as a combination circuit, or device, of a frequency doubler and an inverter.

Figure 8A:
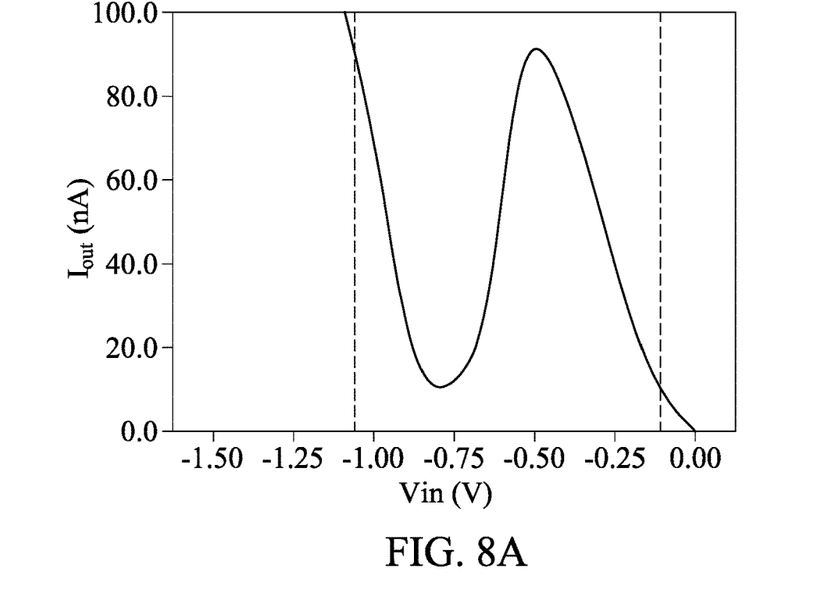
FIG. 8A is a chart illustrating an output current signal versus the input signal in FIG. 4, in accordance with some embodiments of the present disclosure.
Figure 8B:
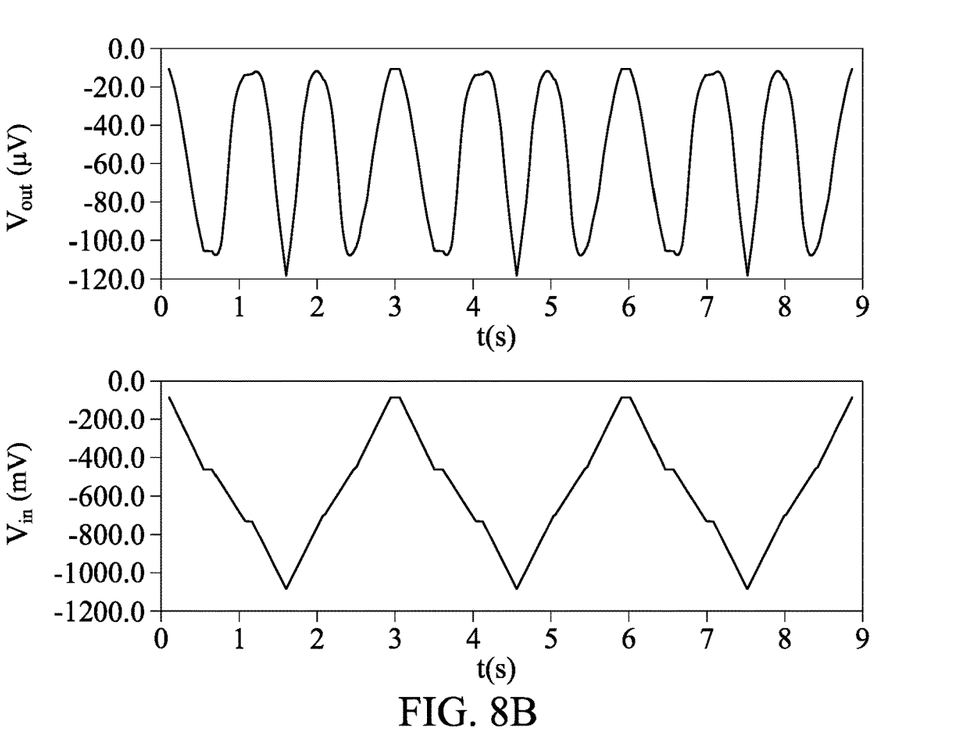
FIG. 8B illustrates the input signal and the corresponding output voltage signal.

Reference is now made to both of FIG. 8A and FIG. 8B. FIG. 8A is a chart illustrating the output current signal Iout versus the input signal Vin in FIG. 4, in accordance with some embodiments of the present disclosure. FIG. 8B illustrates the input signal Vin and the corresponding output voltage signal Vout.

For illustration with reference to FIG. 8A, the current-voltage curve in the embodiments shown in FIG. 8A is similar to the current-voltage curve in the embodiments shown in FIG. 5A, FIG. 6A and FIG. 7A. For illustration, the device 10 is configured to operate with positive transconductance when the input signal Vin is larger than the first voltage value, that is in a range between 0 Volts and −0.5 Volts. The device 10 is configured to operate with negative transconductance when the input signal Vin is in a range between the first voltage value and the second voltage value, that is in a range between about −0.5 Volts and about −0.8 Volts. The device 10 is further configured to operate with positive transconductance when the input signal Vin is smaller than the second voltage value, that is in a range between about −0.8 Volts and about −1.5 Volts.

For illustration with reference to FIG. 8B, in some embodiments, the input signal Vin is a triangular wave and the voltage level of the input signal Vin oscillates between about −100 mV and about −1100 mV. For illustration, when the voltage level of the input signal Vin is configured in a range including the first value (e.g., about −500 mV), and the second value (e.g., about −800 mV) For illustration with reference to FIG. 8A, the output voltage signal Vout has a frequency that is three times a frequency of the input signal. In other words, when the input signal Vin oscillates within a range including the first voltage value (e.g., about −500 mV) and the second voltage value (e.g., about −800 mV), the output voltage signal Vout is configured to have a frequency that is three times a frequency of the input signal Vin. For example, as shown in FIG. 8B, in some embodiments, in the first half of the oscillation of the input signal Vin, the input signal Vin is changed from about −100 mV to about −1100 mV, the absolute value of the input signal increasing. Firstly, the absolute value of the output voltage signal Vout increases from about 10 μV to about 110 μV as the device 10 operating with positive transconductance in a voltage range between about −100 mV and about −500 mV. Secondly, the absolute value of the output voltage signal Vout decreases from about 110 μV to about 10 μV as the device 10 operating with negative transconductance in a voltage range between about −500 mV and about −800 mV. Thirdly the absolute value of the output voltage signal Vout increases from about 10 μV to about 110 μV as the device 10 operating with positive transconductance in a voltage range between about −800 mV and about −1100 mV. Alternatively, in the second half of the oscillation of the input signal Vin, the input signal Vin is changed from about −1100 mV to about −100 mV, the absolute value of the input signal decreasing. Firstly, the absolute value of the output voltage signal Vout decreases from about 110 μV to about 10 μV as the device 10 operating with positive transconductance in a voltage range between about −1100 mV and about −800 mV. Secondly, the absolute value of the output voltage signal Vout increases from about 10 μV to about 110 μV as the device 10 operating with negative transconductance in a voltage range between about −800 mV and about −500 mV. Thirdly, the absolute value of the output voltage signal Vout decreases from about 110 μV to about 10 μV as the device 10 operating with positive transconductance in a voltage range between about −500 mV and about −100 mV. In other words, when the input signal Vin oscillates one time, the output voltage signal Vout oscillates three times. Explained in a different way, based on the above, the device 10 in FIG. 4 operates as a frequency tripler circuit or device.

Figure 9A:
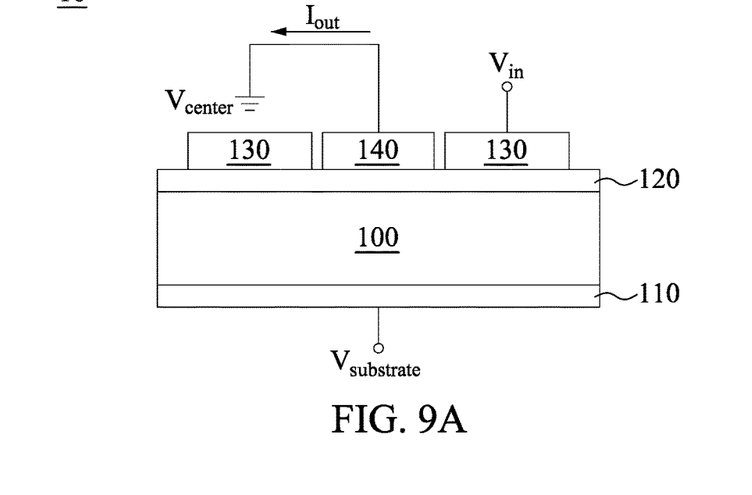
FIG. 9A is a schematic diagram of the device operating with an input signal and a substrate bias, in accordance with some embodiments of the present disclosure.

Reference is now made to FIG. 9A. FIG. 9A is a schematic diagram of the device 10 operating with the input signal Vin and a substrate bias Vsubstrate, in accordance with some embodiments of the present disclosure.

Compared with the device 10 in FIG. 2, like elements in FIG. 9A are designated with the same reference numbers for ease of understanding. For illustration as reference to FIG. 9A, the bottom electrode 110 is configured to be biased with an operating voltage that is adjustable for modifying the output current signal Iout. In some embodiments. for illustration with reference to FIG. 9A, the bottom electrode 110 is coupled to a substrate bias Vsubstrate which is applied as an operating voltage. Furthermore, in some embodiments, the substrate bias Vsubstrate is one of a negative voltage bias and a positive voltage bias. For example, the substrate bias Vsubstrate can be about −0.4V or about +0.12V.

Figure 9B:
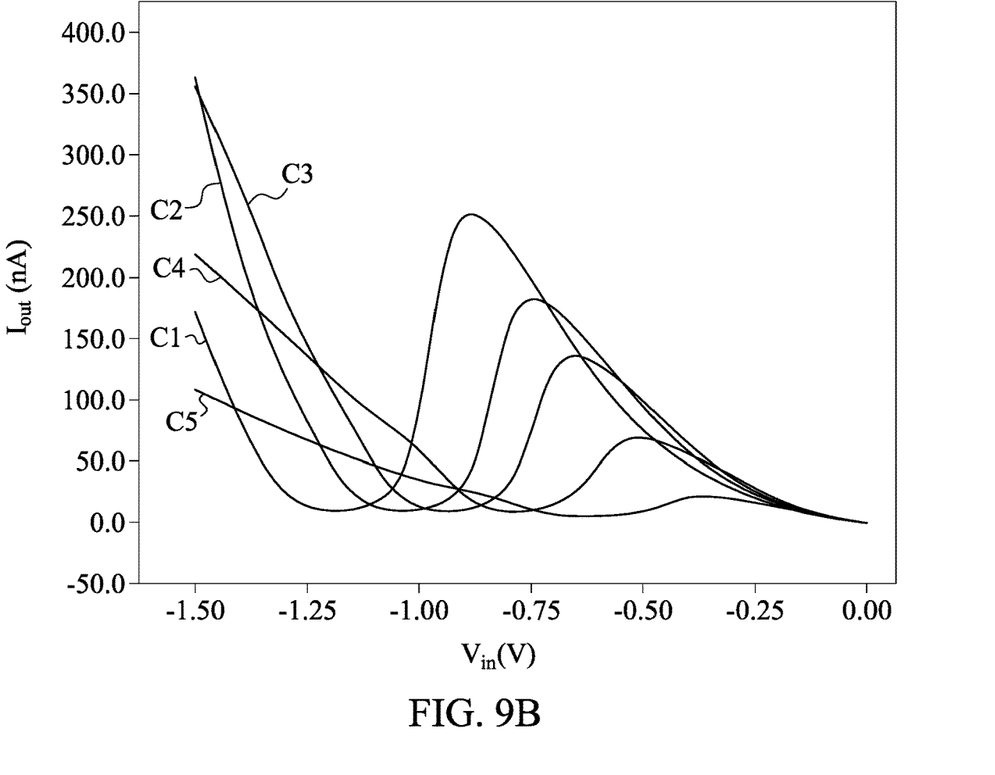
FIG. 9B is a chart illustrating output current signals generated when the device in FIG. 9A is operating with some substrate bias, in accordance with some embodiments of the present disclosure.

Reference is now made to FIG. 9B. FIG. 9B is a chart illustrating the output current signals Iout versus the input signal Vin with various substrate bias, in accordance with some embodiments of the present disclosure.

For illustration, curves C1-C5 illustrate that the output current signal Iout modified by various substrate bias has different peak current value corresponding to different first voltage value and different valley current value corresponding to different second voltage values. For example, in some embodiments, curve C1-C3 are generated with negative substrate bias, in which the substrate bias Vsubstrate are about −0.4 Volts, −0.25 Volts and −0.15 Volts respectively, curve C4 is generated without substrate bias, and curve C5 is generated with positive substrate bias which is about 0.15 Volts. Because the negative substrate bias enhances the coupling between the charges under the ring MIS structure and the charges under the center MIS structure, as curve C1-C3 shown in FIG. 9B, when the substrate bias Vsubstrate is negative and the absolute value of the substrate bias Vsubstrate increases, the peak current value of the output current signal Iout increases and both of the absolute value of the first voltage value and the absolute value of the second voltage value increase. Alternatively, when the positive substrate bias is applied, as curve C5 shown in FIG. 9B, the peak current value of the output current signal Iout decreases and both of the absolute value of the first voltage value and the absolute value of the second voltage value decrease.

It should be noticed that the arrangements of the substrate bias Vsubstrate are given for illustrative purposes. Various arrangements of the substrate bias Vsubstrate are within the contemplated scope of the present disclosure. For instance, in some embodiments, the substrate bias Vsubstrate can changed according to a bias applied on the input signal Vin, as will be discussed in detail below.

Figure 10:
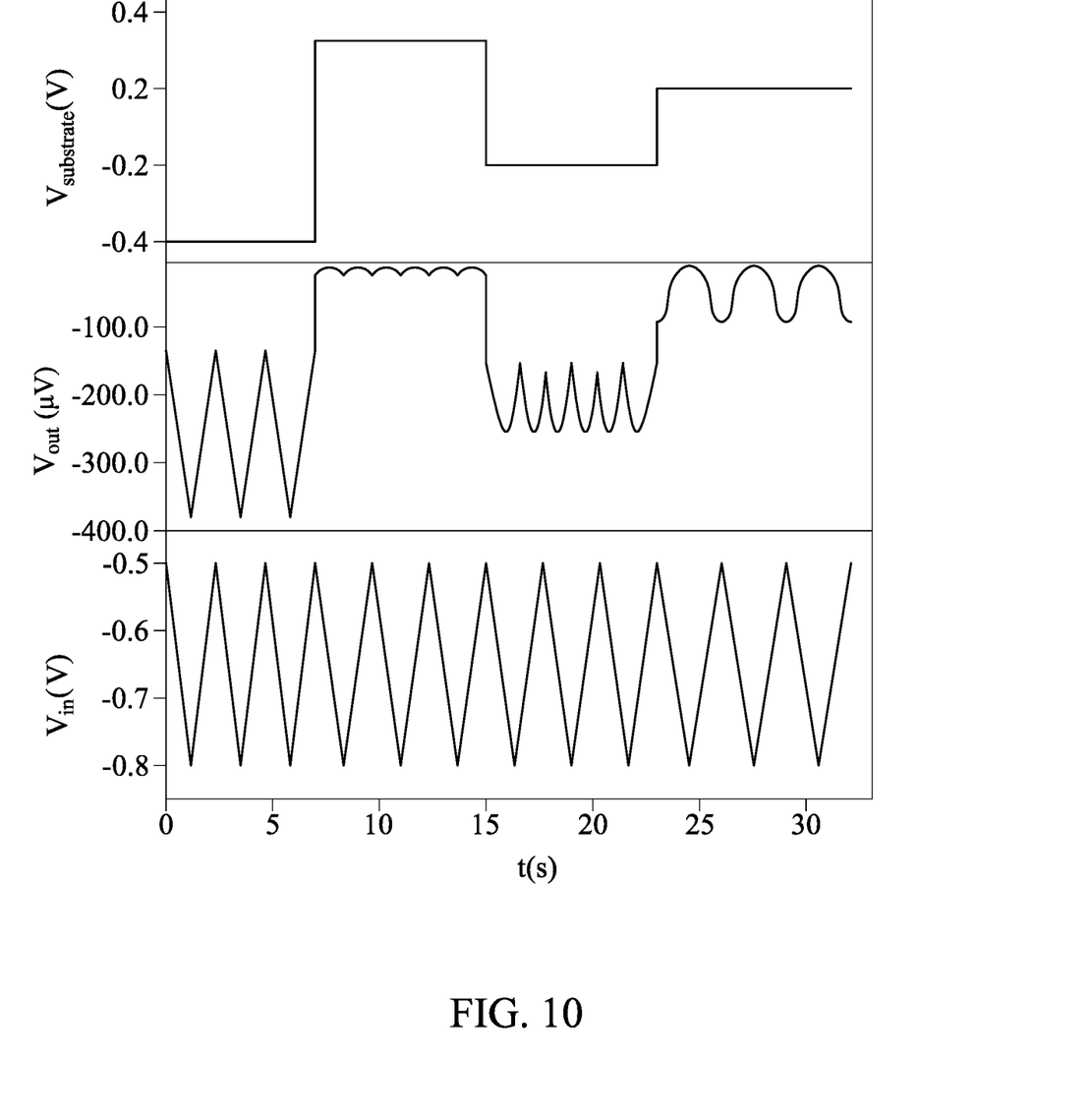
FIG. 10 is a chart illustrating a substrate bias signal, an input signal and an output current signal of the device, in accordance with some embodiments of the present disclosure.

Reference is now made to FIG. 10. FIG. 10 is a chart illustrating the substrate bias signal Vsubstrate, the input signal Vin and an output current signal Iout of the device 10, in accordance with some embodiments of the present disclosure.

For illustration, the bottom electrode 110 is configured to be biased with an operating voltage, such as the substrate bias Vsubstrate, and the operating voltage is associated with the output voltage signal Vout and configured to be adjusted to modify the output voltage signal Vout. For example, in some embodiments, the input signal Vin, as an oscillating signal, oscillates between about −0.5V to about −0.8V and the voltage level of the electrode 140 is 0 Volts. For illustration with reference to FIG. 10, firstly, when the substrate bias Vsubstrate which is about −0.4 Volts is applied, the output voltage signal Vout has the same phase and frequency as the input signal Vin. Secondly, when the substrate bias Vsubstrate which is about 0.12 Volts is applied, the output voltage signal Vout has a frequency which is twice of the frequency of input signal Vin and is out-of-phase. Thirdly, when the substrate bias Vsubstrate which is about −0.225 Volts is applied, the output voltage signal Vout has a frequency which is twice of the frequency of input signal Vin. Fourthly, when there is no bias on the electrode 110, the output voltage signal Vout is out-of-phase of the input signal Vin. In other words, the device 10 can perform different operations by receiving different substrate bias Vsubstrate while the voltage swing of the input signal Vin remains the same.

Figure 11:
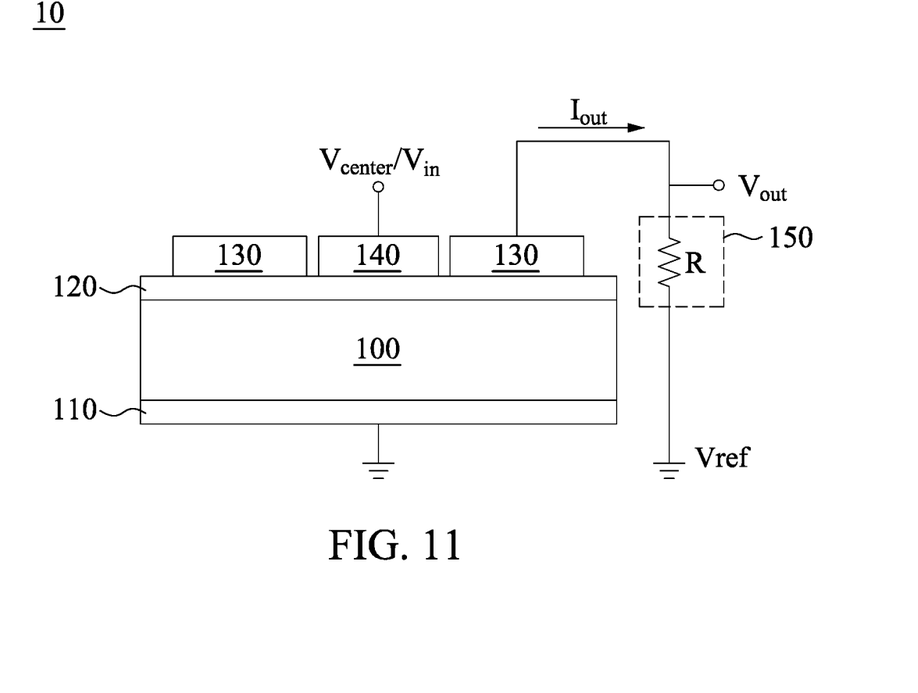
FIG. 11 is a schematic diagram of the device operating with an input signal, in accordance with some embodiments of the present disclosure.

Reference is now made to FIG. 11. FIG. 11 is a schematic diagram of the device 10 operating with the input signal Vin, in accordance with some embodiments of the present disclosure.

Compared with the device 10 in FIG. 4, like elements in FIG. 11 are designated with the same reference numbers for ease of understanding. For illustration, the electrode 140 can be configured to be applied with the input signal Vin, and the electrode 130 can be configured to output the output current signal Iout that is configured to be converted into the output voltage signal Vout. Furthermore, the current-to-voltage converter 150 can be coupled between a reference voltage Vref and the electrode 130 in order to output the output current signal Iout. In some embodiments, the current-to-voltage converter 150 can be a resistive device, such as a resistor R.

According to some embodiments of the present disclosure discussed above, the device 10 can be configured to manipulate a frequency, a phase or a combination thereof of the output voltage signal Vout according to a magnitude of the input signal Vin. In some embodiments, the detail of the operation of device 10 is summed up as Table I below:

TABLE I the operation of the device 10 and the range of the input signal Vin

| Operation | Inverter | Frequency doubler | Frequency doubler and inverter | Frequency tripler |
|---|---|---|---|---|
| Vin(mV) | −500 + $\Delta V$∼−800 + $\Delta V$ | −305 + $\Delta V$∼−605 + $\Delta V$ | −635 + $\Delta V$∼−935 + $\Delta V$ | −100 + $\Delta V$∼−1100 + $\Delta V$ |
| Vsubstrate(V) | | 0 + $\Delta V$ | | |

For illustration, as Table I mentioned above, when a deviation voltage $\Delta V$ is applied on the substrate bias Vsubstrate, the voltage range of the input signal Vin for device 10 operating in a specific mode can be shifted by the deviation voltage $\Delta V$, compared with the voltage range of the input signal Vin for device 10 operating in the same mode with 0 Volts bias on the bottom electrode 110. It should be noticed that the deviation voltage $\Delta V$ can be any arbitrary voltage.

In some embodiments, the input signal Vin oscillates between about −500 mV to −800 mV, the detail of the operation of device 10 is summed up as Table II below:

TABLE II the operation of the device 10 and the range of the substrate bias Vsubstrate

| Operation | Inverter | Frequency doubler | Frequency doubler and inverter | Frequency tripler |
|---|---|---|---|---|
| Vin(mV) | | −500 + $\Delta V$∼−800 + $\Delta V$ | | |
| Vsubstrate(V) | −0.4 + $\Delta V$ | 0 + $\Delta V$ | 0.12 + $\Delta V$ | −0.225 + $\Delta V$ |

For illustration, as Table II mentioned above, when a deviation voltage ΔV is applied on the input signal Vin, the voltage range of the substrate bias Vsubstrate for device 10 operating in a specific mode can be shifted by the deviation voltage ΔV, compared with the voltage range of the substrate bias Vsubstrate for device 10 operating in the same mode with 0 Volts bias applied on the input signal Vin. It should be noticed that the deviation voltage ΔV can be any arbitrary voltage.

The arrangements of the input signal Vin and the substrate bias Vsubstrate are given for illustrative purposes. Various arrangements of the input signal Vin and the substrate bias Vsubstrate are within the contemplated scope of the present disclosure.

As described above, the device in the present disclosure is able to generate, with simple structure, an output signal having a frequency which is the same, two times or three times of the frequency of and being in-phase or out-of-phase of the input signal. Moreover, the device 10 in the present disclosure is able to switch in different operation mode by receiving a substrate bias.

In some embodiments, a device is disclosed that includes an insulating layer, a first electrode, a second electrode, and a bottom electrode. The insulating layer is disposed on a first surface of a substrate. The first electrode and the second electrode are disposed on a first surface of the insulating layer. The first electrode receives an input signal, and the second electrode outputs, in response to the input signal, an output signal. The bottom electrode is disposed on a second surface, opposite to the first surface, of the substrate and receives an operating voltage to modify a frequency of the output signal.

Also disclosed is a device that includes a substrate, a continuous electrode, a top electrode, an insulating layer, and a bottom electrode. The continuous electrode and the top electrode are disposed on a first side of the substrate. A first portion of the continuous electrode and a second portion of the continuous electrode are arranged on opposite sides of the top electrode. The insulating layer continuously extends along a first surface of the substrate and sandwiched between the substrate, the continuous electrode, and the top electrode. The bottom electrode is disposed on a second surface, opposite to the first surface, of the substrate.

Also disclosed is a method that includes the operation below: controlling a frequency of an output signal generated from a first electrode or a phase of the output signal, with respect to an oscillating signal, by adjusting a voltage swing of the oscillating signal received by a second electrode or adjusting a voltage level of an operating voltage applied on a third electrode. In some embodiments, the first electrode and the second electrode are disposed on an insulating layer on a semiconductor substrate, wherein the insulating layer extends continuously from a bottom side of the first electrode to a bottom side of the second electrode, and the third electrode is disposed on, opposite to the insulating layer, the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
an insulating layer disposed on a first surface of a substrate;
a first electrode and a second electrode that are disposed on a first surface of the insulating layer, wherein the first electrode is configured to receive an input signal, and the second electrode is configured to output, in response to the input signal, an output signal, wherein the first electrode surrounds the second electrode, or the second electrode surrounds the first electrode; and
a bottom electrode disposed on a second surface, opposite to the first surface, of the substrate, wherein the bottom electrode is configured to receive an operating voltage to modify a frequency of the output signal.

2. The device of claim 1, wherein the insulating layer extends continuously from a bottom side of the first electrode to a bottom side of the second electrode.

3. The device of claim 1, further comprising:
a current-to-voltage converter coupled between the second electrode and a reference voltage, and configured to receive an output current signal as the output signal from the second electrode.

4. The device of claim 1, wherein the output signal includes a first portion that decreases correspondingly to an absolute value of a voltage level of the input signal increasing from a first value to a second value.

5. The device of claim 4, wherein when the operating voltage has a negative voltage level, an oscillation frequency of the output signal is twice a value of an oscillation frequency of the input signal,
wherein when the operating voltage has a positive voltage level, the oscillation frequency of the output signal is twice the value of the oscillation frequency of the input signal and a phase of the output signal is an inverted phase of the input signal.

6. The device of claim 4, wherein when the voltage level of the input signal is within a range between the first value and the second value, a peak value of the input signal corresponds to a valley value of the output signal.

7. The device of claim 6, wherein the output signal further includes a second portion that decreases correspondingly to the absolute value of the voltage level of the input signal decreasing from the first value to a third value,
wherein when the voltage level of the input signal is within a range between the first value and the third value, an oscillation frequency of the output signal is greater an oscillation frequency of the input signal.

8. The device of claim 6, wherein the output signal further includes a second portion that increases correspondingly to the absolute value of the voltage level of the input signal increasing from the second value to a third value,
wherein when the input signal oscillates with a frequency and the voltage level of the input signal is within a range between the first value and the third value, an oscillation frequency of the output signal is twice the value of the frequency and a valley value of the input signal corresponds to a peak value of the output signal.

9. The device of claim 1, wherein the output signal oscillates with a frequency three times a value of an oscillation frequency of the input signal.

10. A device, comprising:
a substrate;
a continuous electrode and a top electrode that are disposed on a first side of the substrate, wherein a first portion of the continuous electrode and a second portion of the continuous electrode are arranged on opposite sides of the top electrode;
an insulating layer continuously extending along a first surface of the substrate and sandwiched between the substrate, the continuous electrode, and the top electrode; and
a bottom electrode disposed on a second surface, opposite to the first surface, of the substrate.

11. The device of claim 10, wherein the continuous electrode surrounds the top electrode.

12. The device of claim 10, wherein the bottom electrode extends continuously from a bottom side of the first portion of the continuous electrode to a bottom side of the second portion of the continuous electrode.

13. The device of claim 10, wherein the continuous electrode is configured to output a current signal in response to an input signal received at the top electrode;
wherein the bottom electrode is configured to be biased with an operating voltage that is adjustable for modifying an oscillation frequency of the current signal.

14. The device of claim 13, wherein when the input signal is configured to oscillate within a range between a first value and a second value, the current signal is configured to be a signal inverted from the input signal.

15. The device of claim 10, further comprising:
a current-to-voltage converter coupled between a reference voltage and one of the continuous electrode and the top electrode;
wherein the one of the continuous electrode and the top electrode is configured to generate a current signal to the current-to-voltage converter that is configured to generate an output signal based on the current signal;
wherein the bottom electrode is configured to be biased with an operating voltage that is adjustable for modifying a voltage swing of the output signal.

16. The device of claim 10, wherein the top electrode is configured to output a current signal in response to an input signal received at the continuous electrode;
wherein the device further comprises:
a resistor coupled between the top electrode and a reference voltage, and configured to generate an output signal based on the current signal.

17. A method, comprising:
controlling a frequency of an output signal generated from a first electrode or a phase of the output signal, with respect to an oscillating signal, by adjusting a voltage swing of the oscillating signal received by a second electrode or adjusting a voltage level of an operating voltage applied on a third electrode when the oscillating signal is received by the second electrode; and
controlling a voltage swing of the output signal by adjusting the voltage level of the operating voltage,
wherein the first electrode and the second electrode are disposed on an insulating layer on a semiconductor substrate, wherein the insulating layer extends continuously from a bottom side of the first electrode to a bottom side of the second electrode, and the third electrode is disposed on, opposite to the insulating layer, the semiconductor substrate.

18. The method of claim 17, wherein controlling the frequency of the output signal comprises:
increasing the voltage swing of the oscillating signal to control the frequency of the output signal being three times a value of a frequency of the oscillating signal.

19. The method of claim 17, wherein controlling the phase of the output signal comprises:
increasing the voltage level of the operating voltage to control the phase of the output signal being inverted from a phase of the oscillating signal.

20. The method of claim 17, wherein controlling the frequency of the output signal comprises:
applying the operating voltage having a negative voltage level on the third electrode to control the frequency of the output signal being twice a value of a frequency of the oscillating signal.

* * * * *